(12) United States Patent
Fukuda

(10) Patent No.: US 8,436,515 B2
(45) Date of Patent: May 7, 2013

(54) PIEZOELECTRIC VIBRATOR HAVING A PIEZOELECTRIC VIBRATING STRIP AND A BONDING FILM WITH LASER IRRADIATION MARKS

(75) Inventor: Junya Fukuda, Chiba (JP)

(73) Assignee: Seiko Instruments Inc., Chiba (JP)

( * ) Notice: Subject to any disclaimer, the term of this patent is extended or adjusted under 35 U.S.C. 154(b) by 432 days.

(21) Appl. No.: 12/842,643

(22) Filed: Jul. 23, 2010

(65) Prior Publication Data

US 2011/0018388 A1     Jan. 27, 2011

(30) Foreign Application Priority Data

Jul. 24, 2009   (JP) ................................ 2009-173383

(51) Int. Cl.
*H01L 41/053*     (2006.01)
(52) U.S. Cl.
USPC .......................................... 310/344; 310/370
(58) Field of Classification Search .................. 310/344, 310/370
See application file for complete search history.

(56) References Cited

U.S. PATENT DOCUMENTS

| | | | |
|---|---|---|---|
| 6,924,582 B2* | 8/2005 | Shimizu et al. | 310/312 |
| 7,843,115 B2* | 11/2010 | Dalla Piazza et al. | 310/344 |
| 8,212,454 B2* | 7/2012 | Onitsuka et al. | 310/348 |
| 8,304,965 B2* | 11/2012 | Aratake et al. | 310/344 |
| 2008/0309202 A1 | 12/2008 | Dalla Piazza et al. | |
| 2010/0156237 A1 | 6/2010 | Ichikawa et al. | |
| 2011/0050046 A1* | 3/2011 | Onitsuka et al. | 310/344 |
| 2011/0164473 A1* | 7/2011 | Onitsuka et al. | 368/47 |
| 2011/0169584 A1* | 7/2011 | Fukuda | 331/158 |

FOREIGN PATENT DOCUMENTS

| | | | |
|---|---|---|---|
| JP | 53149794 A | * | 12/1978 |
| JP | 2003-142976 A | | 5/2003 |
| JP | 2003142976 A | * | 5/2003 |
| JP | 2007251239 A | * | 9/2007 |
| JP | 2007311914 A | * | 11/2007 |
| JP | 2011049992 A | * | 3/2011 |

OTHER PUBLICATIONS

Office Action from co-pending U.S. Appl. No. 12/984,198, dated Oct. 2, 2012, 10 pages.

* cited by examiner

*Primary Examiner* — Jaydi San Martin
(74) *Attorney, Agent, or Firm* — Brinks Hofer Gilson & Lione

(57) ABSTRACT

Provide a highly efficient manufacturing method of a piezoelectric vibrator and to provide a piezoelectric vibrator manufactured by this manufacturing method. A method for manufacturing a piezoelectric vibrator 1 including: a base board 2 and a lid board 3 which are superimposed on each other so as to form a cavity therebetween; a piezoelectric vibrating reed 4 which is accommodated in the cavity and bonded to the base board; a bonding film 35 which is formed on the entire surface of the lid board on the opposite side to the base board so as to bond both boards to each other at a portion thereof being in contact with the base board, wherein the piezoelectric vibrating reed includes a pair of vibrating arms 10 and 11 and a weight metal film 21 formed on a tip end of each of the vibrating arms, wherein the bonding film is formed of a material which is capable of absorbing surrounding gas by being activated with laser irradiation, and wherein the method includes a laser irradiation step of simultaneously irradiating the weight metal film and the bonding film with a laser beam.

6 Claims, 14 Drawing Sheets

PIEZOELECTRIC VIBRATOR HAVING A PIEZOELECTRIC VIBRATING STRIP AND A BONDING FILM WITH LASER IRRADIATION MARKS

RELATED APPLICATIONS

This application claims priority under 35 U.S.C. §119 to Japanese Patent Application No. 2009-173383 filed on Jul. 24, 2009, the entire content of which is hereby incorporated by reference.

BACKGROUND OF THE INVENTION

1. Field of the Invention

The present invention relates to an SMD-type piezoelectric vibrator in which a piezoelectric vibrating reed is sealed in a cavity formed between two bonded boards, a manufacturing method of the piezoelectric vibrator, and an oscillator, an electronic device, and a radio-controlled clock each having the piezoelectric vibrator.

2. Description of the Related Art

Recently, a piezoelectric vibrator using a piezoelectric vibrating reed made of a piezoelectric material such as quartz crystal is used in a cellular phone and a portable information terminal as the time source, the timing source of a control signal, a reference signal source, and the like. As the piezoelectric vibrating reed, a turning-fork type piezoelectric vibrating reed having a pair of vibrating arms is used.

As the piezoelectric vibrator of this type, an SMD (Surface Mount Device)-type piezoelectric vibrator is known.

As an SMD-type piezoelectric vibrator 200, there is proposed one as shown in FIGS. 14 and 15 in which a package 209 is formed by a base board 201 and a lid board 202, and a piezoelectric vibrating reed 203 is accommodated in a cavity C formed inside the package 209. The base board 201 and the lid board 202 are bonded to each other by an anodic bonding using a bonding film 207 which is disposed between both boards.

Meanwhile, in general piezoelectric vibrators, it is preferable to suppress an equivalent resistance value (effective resistance value Re) to a low value. Since a piezoelectric vibrator having a low equivalent resistance value is capable of vibrating a piezoelectric vibrating reed with a low power, a piezoelectric vibrator having high energy efficiency can be achieved.

As a typical method of suppressing the equivalent resistance value, as shown in FIGS. 14 and 15, there is known a method of creating a near-perfect vacuum in the sealed cavity C of the piezoelectric vibrating reed 203 so as to decrease a series resonance resistance value (R1) which is proportional to the equivalent resistance value. Moreover, as a method of creating a near-perfect vacuum in the cavity C, JP-A-2003-142976 discloses a method (gettering method) of sealing a gettering material 220 made, for example, of aluminum in the cavity C and activating the gettering material 220 with laser irradiation from the outside. According to this method, since oxygen generated at the time of anodic bonding can be absorbed by the activated gettering material 220, it is possible to create a near-perfect vacuum in the cavity C.

Moreover, in general, after the gettering step, a step (fine tuning step) of irradiating a weight metal film 211 formed at the tip end of a vibrating arm 210 with a laser beam to trim the weight metal film 211, thus finely tuning the frequency of the piezoelectric vibrating reed 203 is performed. By performing this fine tuning step, the frequency of the piezoelectric vibrating reed 203 can be made to fall within the predetermined range of the nominal frequency.

However, in the manufacturing method of the piezoelectric vibrator according to the related art, since the fine tuning step is performed after the gettering step so that the degree of vacuum in the cavity and the frequency of the piezoelectric vibrating reed are adjusted respectively, the adjustment takes lots of time, thus deteriorating manufacturing efficiency. Moreover, the formation of the gettering material necessary for gettering takes time, and the manufacturing efficiency is deteriorated further.

SUMMARY OF THE INVENTION

The present invention has been made in view of the foregoing, and an object of the present invention is to provide a highly efficient manufacturing method of a piezoelectric vibrator and to provide a piezoelectric vibrator manufactured by this manufacturing method.

The present invention provides the following means in order to solve the problems.

According to an aspect of the present invention, there is provided a method for manufacturing a piezoelectric vibrator including: a base board and a lid board which are superimposed on each other so as to form a cavity therebetween; a piezoelectric vibrating reed which is accommodated in the cavity and bonded to the base board; a bonding film which is formed on the entire surface of the lid board on the opposite side to the base board so as to bond both boards to each other at a portion thereof being in contact with the base board, wherein the piezoelectric vibrating reed includes a pair of vibrating arms and a weight metal film formed on a tip end of each of the vibrating arms, wherein the bonding film is formed of a material which is capable of absorbing surrounding gas by being activated with laser irradiation, and wherein the method includes a laser irradiation step of simultaneously irradiating the weight metal film and the bonding film with a laser beam.

According to this aspect, since the bonding film is formed of a material capable of absorbing surrounding gas by being activated with laser irradiation, it is possible to increase the degree of vacuum in the cavity by gettering the bonding film with laser irradiation. Therefore, by simultaneously irradiating the weight metal film and the bonding film with a laser beam in the laser irradiation step, it is possible to increase the degree of vacuum in the cavity by gettering the bonding film simultaneously with the adjusting of the frequency of the piezoelectric vibrating reed by trimming the weight metal film.

Moreover, since the bonding film is formed of a material which is capable of absorbing surrounding gas by being activated with laser irradiation, it is not necessary to form an additional gettering material.

Given the above, it is possible to manufacture the piezoelectric vibrator with high efficiency and thus to achieve cost-reduction of the piezoelectric vibrator.

Moreover, the manufacturing method may further include a preliminary gettering step where portions of the bonding film in the cavity are irradiated with a laser beam, the portions being located at positions where they do not overlap with the weight metal film as viewed from the normal direction of the base board.

In this case, since the manufacturing method includes the preliminary gettering step, it is possible to increase the degree of vacuum in the cavity to an extent similar to that achieved by gettering the bonding film during the laser irradiation step to increase the degree of vacuum in the cavity.

Moreover, the preliminary gettering step may be performed before the laser irradiation step.

In this case, since the preliminary gettering step is performed before the laser irradiation step, it is possible to adjust the frequency of the piezoelectric vibrating reed with higher precision than in a case of performing the preliminary gettering step after the laser irradiation step.

That is to say, when the preliminary gettering step is performed, there is a case where materials constituting the bonding film having been irradiated with a laser beam are scattered and deposited onto the vibrating arms, thus changing the frequency of the piezoelectric vibrating reed. For this reason, when the preliminary gettering step is performed after the laser irradiation step, there is a concern that the frequency of the piezoelectric vibrating reed having been adjusted by the laser irradiation step will be changed by the execution of the preliminary gettering step. However, if the preliminary gettering step is performed before the laser irradiation step, even when the frequency of the piezoelectric vibrating reed is changed by the preliminary gettering step, the frequency can be adjusted later in the laser irradiation step. Therefore, it is possible to adjust the frequency of the piezoelectric vibrating reed with high precision.

Furthermore, the laser irradiation step may include a step of irradiating portions of the bonding film with a laser beam, the portions being adjacent to the tip ends of the vibrating arms as viewed from the normal direction of the base board.

In this case, by irradiating portions of the bonding film with a laser beam during the laser irradiation step, the portions being adjacent to the tip ends of the vibrating arms as viewed from the normal direction of the base board, it is possible to perform frequency adjustment in a direction of decreasing the frequency of the piezoelectric vibrating reed and thus to increase the yield of the piezoelectric vibrator.

That is to say, when the frequency adjustment is achieved by trimming the weight metal film, since the weight of the weight metal film on the tip ends of the vibrating arms is decreased, whereby the frequency adjustment can be performed in a direction of increasing the frequency of the piezoelectric vibrating reed. Here, by irradiating portions of the bonding film with a laser beam, the portions being adjacent to the tip ends of the vibrating arms, it is possible to cause the materials constituting the bonding film to be scattered and deposited onto the tip ends of the vibrating arms, thus decreasing the frequency of the piezoelectric vibrating reed. Therefore, even when the weight metal film is trimmed so much as to increase excessively the frequency of the piezoelectric vibrating reed, by irradiating portions of the bonding film with a laser beam, the portions being adjacent to the tip ends of the vibrating arms, it is possible to achieve frequency adjustment in a direction of decreasing the frequency of the piezoelectric vibrating reed. By doing so, it is possible to increase the yield of the piezoelectric vibrator since it is not necessary to stop using the piezoelectric vibrator even in the case of the piezoelectric vibrating reed whose frequency is increased such that stopping it is unavoidable as in the related art.

According to another aspect of the present invention, there is provided a piezoelectric vibrator including: a base board and a lid board which are superimposed onto each other so as to form a cavity therebetween; a piezoelectric vibrating reed which is accommodated in the cavity and bonded to the base board; a bonding film which is formed on the entire surface of the lid board on the opposite side to the base board so as to bond both boards to each other at a portion thereof being in contact with the base board, wherein the piezoelectric vibrating reed includes a pair of vibrating arms and a weight metal film formed on a tip end of each of the vibrating arms, wherein the bonding film is formed of a material which is capable of absorbing surrounding gas by being activated with laser irradiation, and wherein the weight metal film and the bonding film are simultaneously irradiated with a laser beam, and first laser irradiation marks are formed therein.

According to this aspect, since the bonding film is formed of a material capable of absorbing surrounding gas by being activated with laser irradiation, it is possible to increase the degree of vacuum in the cavity by gettering the bonding film with laser irradiation. Therefore, according to the piezoelectric vibrator of the above aspect, by simultaneously irradiating the weight metal film and the bonding film with a laser beam to form first laser irradiation marks therein, it is possible to increase the degree of vacuum in the cavity by gettering the bonding film simultaneously with the adjusting of the frequency of the piezoelectric vibrating reed by trimming the weight metal film.

Moreover, since the bonding film is formed of a material which is capable of absorbing surrounding gas by being activated with laser irradiation, it is not necessary to form an additional gettering material.

Given the above, it is possible to manufacture the piezoelectric vibrator with high efficiency and thus to achieve cost-reduction of the piezoelectric vibrator.

Moreover, second laser irradiation marks may be formed at positions of the bonding film in the cavity where they do not overlap with the weight metal film as viewed from the normal direction of the base board.

In this case, according to the piezoelectric vibrator of the above aspect, by forming the second laser irradiation marks at positions of the bonding film in the cavity where they do not overlap with the weight metal film as viewed from the normal direction of the base board, it is possible to increase the degree of vacuum in the cavity further to an extent similar to that achieved by gettering the bonding film at the time of forming the first laser irradiation marks to increase the degree of vacuum in the cavity.

Furthermore, the second laser irradiation marks may be formed at positions of the bonding film being adjacent to at least the tip ends of the vibrating arms as viewed from the normal direction of the base board.

In this case, according to the piezoelectric vibrator, by forming the second laser irradiation marks at positions of the bonding film being adjacent to the tip ends of the vibrating arms as viewed from the normal direction of the base board, it is possible to perform frequency adjustment in a direction of decreasing the frequency of the piezoelectric vibrating reed and thus to increase the yield of the piezoelectric vibrator.

According to a further aspect of the present invention, there is provided an oscillator in which the piezoelectric vibrator according to the above aspect of the present invention is electrically connected to an integrated circuit as an oscillating piece.

According to a still further aspect of the present invention, there is provided an electronic device in which the piezoelectric vibrator according to the above aspect of the present invention is electrically connected to a time counting portion.

According to a still further aspect of the present invention, there is provided a radio-controlled clock in which the piezoelectric vibrator according to the above aspect of the present invention is electrically connected to a filter portion.

According to these aspects, since they include the piezoelectric vibrator which can be manufactured at a low cost, it is possible to reduce the cost of an oscillator, an electronic device, and a radio-controlled clock.

According to the manufacturing method of the piezoelectric vibrator as in the above aspect of the present invention, it is possible to manufacture the piezoelectric vibrator with high efficiency.

According to the piezoelectric vibrator as in the above aspect of the present invention, high manufacturing efficiency is possible.

DETAILED DESCRIPTION OF THE PREFERRED EMBODIMENTS

First Embodiment

Hereinafter, a piezoelectric vibrator according to a first embodiment of the present invention will be described with reference to the drawings.

As shown in FIGS. 1 to 4, a piezoelectric vibrator 1 according to the present embodiment is an SMD-type piezoelectric vibrator including: a base board 2 and a lid board 3 which are superimposed on each other so as to form a cavity C therebetween; and a piezoelectric vibrating reed 4 which is accommodated in the cavity C and bonded to the base board 2.

Figure 3:
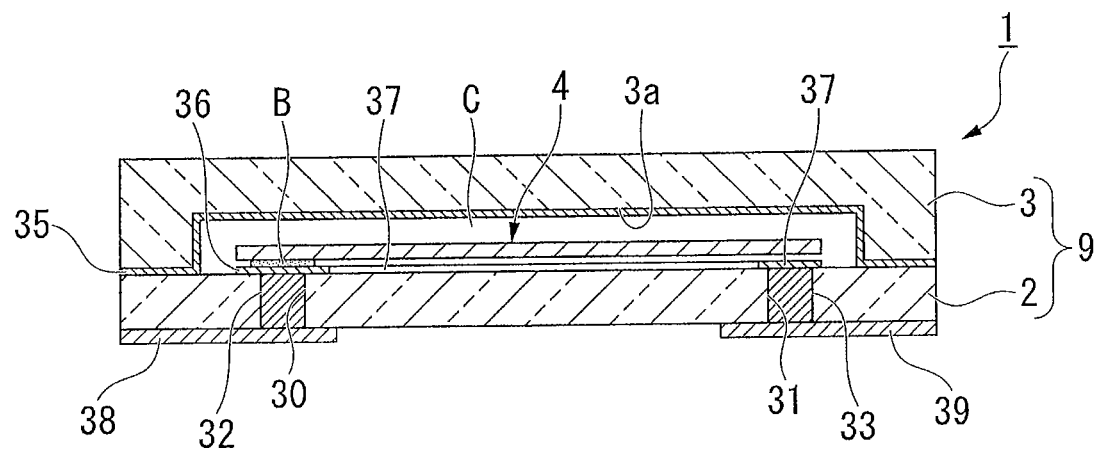
FIG. 3 is a sectional view of the piezoelectric vibrator taken along the line A-A in FIG. 2.
Figure 4:
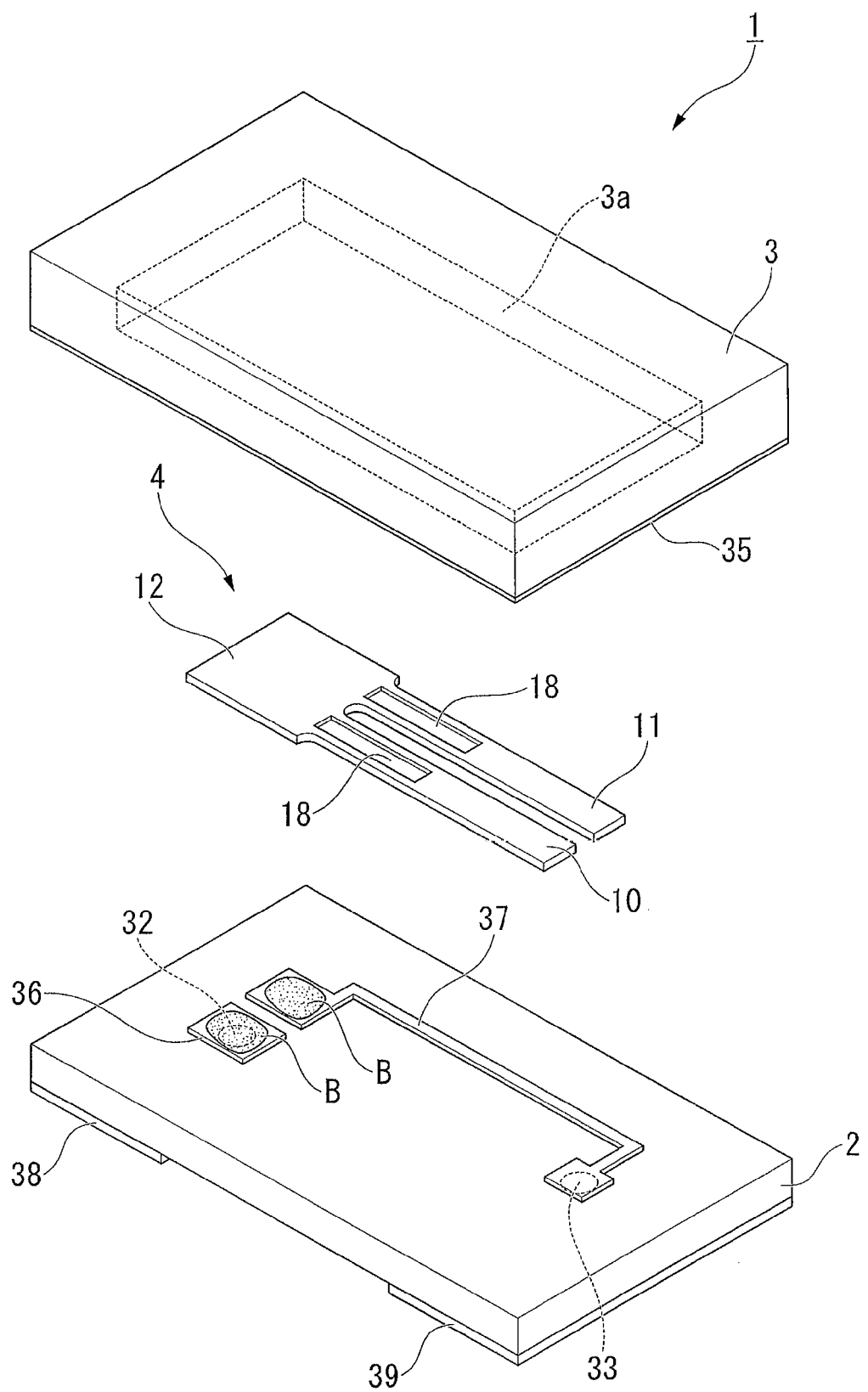
FIG. 4 is an exploded perspective view of the piezoelectric vibrator shown in FIG. 1.

In FIGS. 3 and 4, for better understanding of the drawings, illustrations of the piezoelectric vibrating reed 4, excitation electrode 15, extraction electrodes 19 and 20, mount electrodes 16 and 17, and weight metal film 21 are omitted.

Piezoelectric Vibrating Reed

Figure 5:
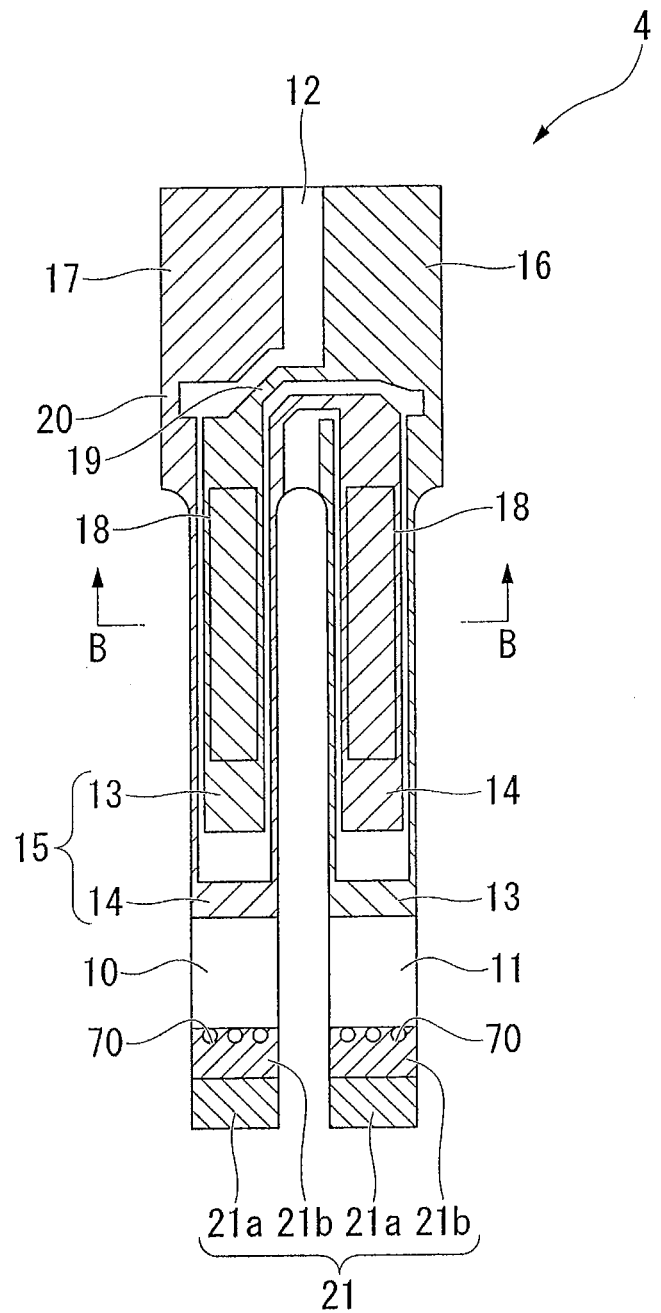
FIG. 5 is a planar view of a piezoelectric vibrating reed constituting the piezoelectric vibrator shown in FIG. 1.
Figure 6:
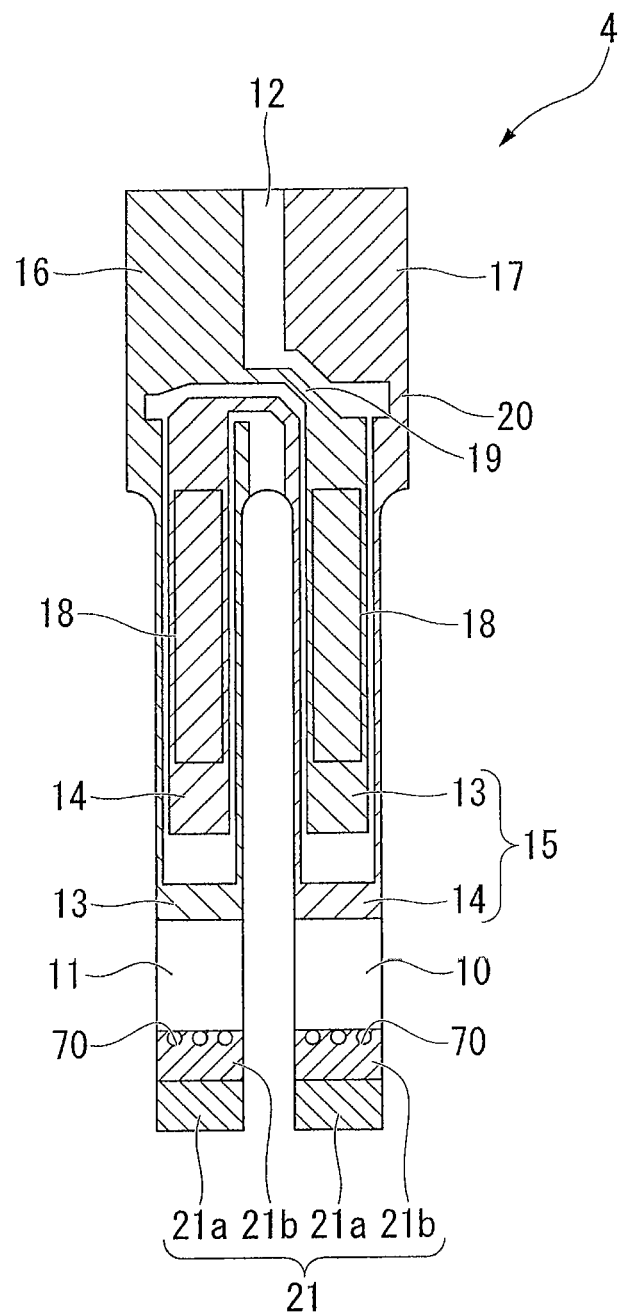
FIG. 6 is a bottom view of the piezoelectric vibrating reed shown in FIG. 5.
Figure 7:
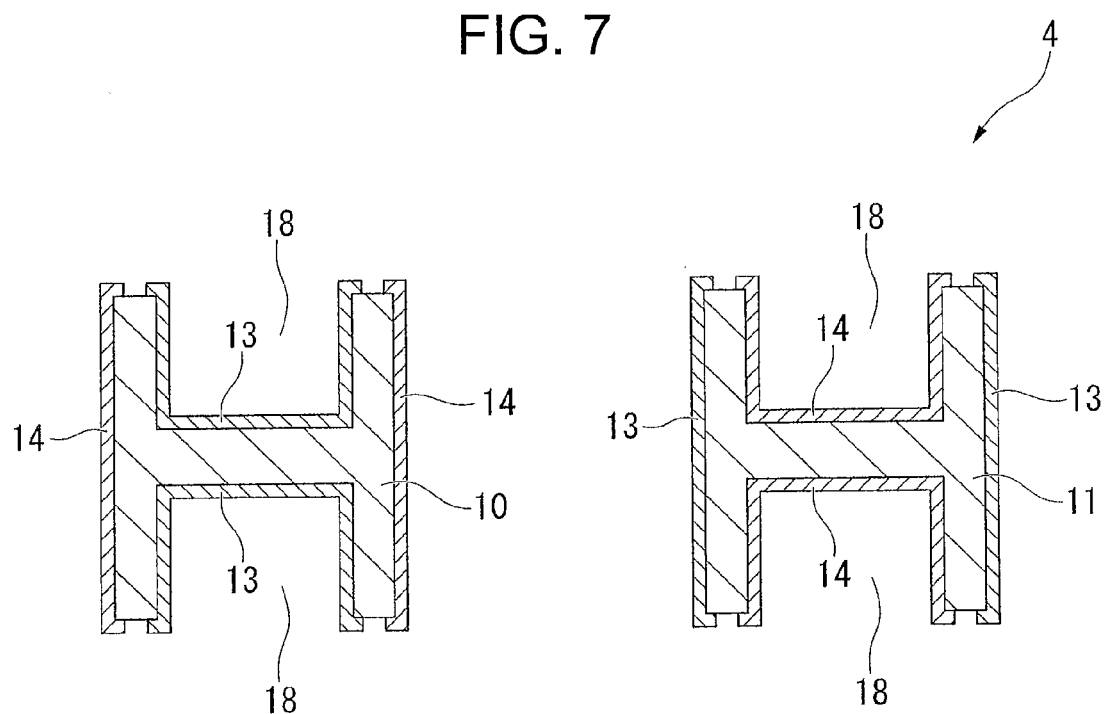
FIG. 7 is a sectional view taken along the line B-B in FIG. 5.

As shown in FIGS. 5 to 7, the piezoelectric vibrating reed 4 is a turning-fork type vibrating reed which is made of a piezoelectric material such as quartz crystal, lithium tantalate, or lithium niobate and is configured to vibrate when a predetermined voltage is applied thereto. The piezoelectric vibrating reed 4 includes: a pair of vibrating arms 10 and 11 disposed in parallel to each other; a base portion 12 to which the base end sides of the pair of vibrating arms 10 and 11 are integrally fixed; an excitation electrode 15 which is formed on the outer surfaces of the base ends of the pair of vibrating arms 10 and 11 so as to allow the pair of vibrating arms 10 and 11 to vibrate and includes a first excitation electrode 13 and a second excitation electrode 14; and mount electrodes 16 and 17 which are electrically connected to the first excitation electrode 13 and the second excitation electrode 14, respectively. The piezoelectric vibrating reed 4 is provided with groove portions 18 which are formed on both principal surfaces of the pair vibrating arms 10 and 11 along the longitudinal direction of the vibrating arms 10 and 11. The groove portions 18 are formed so as to extend from the base end sides of the vibrating arms 10 and 11 up to approximately the middle portions thereof.

The excitation electrode 15 including the first excitation electrode 13 and the second excitation electrode 14 is an electrode that allows the pair of vibrating arms 10 and 11 to vibrate at a predetermined resonance frequency in a direction to move closer to or away from each other and is patterned on the outer surfaces of the pair of vibrating arms 10 and 11 in an electrically isolated state. Specifically, the first excitation electrode 13 is mainly formed on the groove portion 18 of one vibrating arm 10 and both side surfaces of the other vibrating arm 11. On the other hand, the second excitation electrode 14 is mainly formed on both side surfaces of one vibrating arm 10 and the groove portion 18 of the other vibrating arm 11.

Moreover, the first excitation electrode 13 and the second excitation electrode 14 are electrically connected to the mount electrodes 16 and 17 via the extraction electrodes 19 and 20, respectively, on both principal surfaces of the base portion 12. A voltage is applied to the piezoelectric vibrating reed 4 via the mount electrodes 16 and 17. The above-mentioned excitation electrode 15, mount electrodes 16 and 17, and extraction electrodes 19 and 20 are formed by a coating of a conductive film of chromium (Cr), nickel (Ni), aluminum (Al), and titanium (Ti), for example.

Furthermore, the tip ends of the pair of vibrating arms 10 and 11 are coated with a weight metal film 21 for mass adjustment of the vibration states (tuning the frequency) of the vibrating arms 10 and 11 in a manner such as to vibrate within a predetermined frequency range. The weight metal film 21 is divided into a rough tuning film 21a used for tuning the frequency roughly and a fine tuning film 21b used for tuning the frequency finely. By tuning the frequency with the use of the rough tuning film 21a and the fine tuning film 21b, the frequency of the pair of the vibrating arms 10 and 11 can be set to fall within the range of the nominal (target) frequency of the device.

The piezoelectric vibrating reed 4 configured in this way is mounted on an upper surface of the base board 2 by bump bonding using bumps B made of gold or the like as shown in FIGS. 3 and 4. More specifically, bump bonding is achieved in a state where the pair of mount electrodes 16 and 17 comes into contact with two bumps B formed on lead-out electrodes 36 and 37 described later, respectively, which are patterned on the upper surface of the base board 2. In this way, the piezoelectric vibrating reed 4 is supported in a state of being floated from the upper surface of the base board 2, and the mount electrodes 16 and 17 and the lead-out electrodes 36 and 37 are electrically connected to each other.

Piezoelectric Vibrator

As shown in FIGS. 1 to 4, the piezoelectric vibrator 1 according to the present embodiment includes a package 9 in which the base board 2 and the lid board 3 are laminated in two layers.

The base board 2 is a transparent insulating board made of a glass material, for example, soda-lime glass, and is formed in a board-like form.

Figure 2:
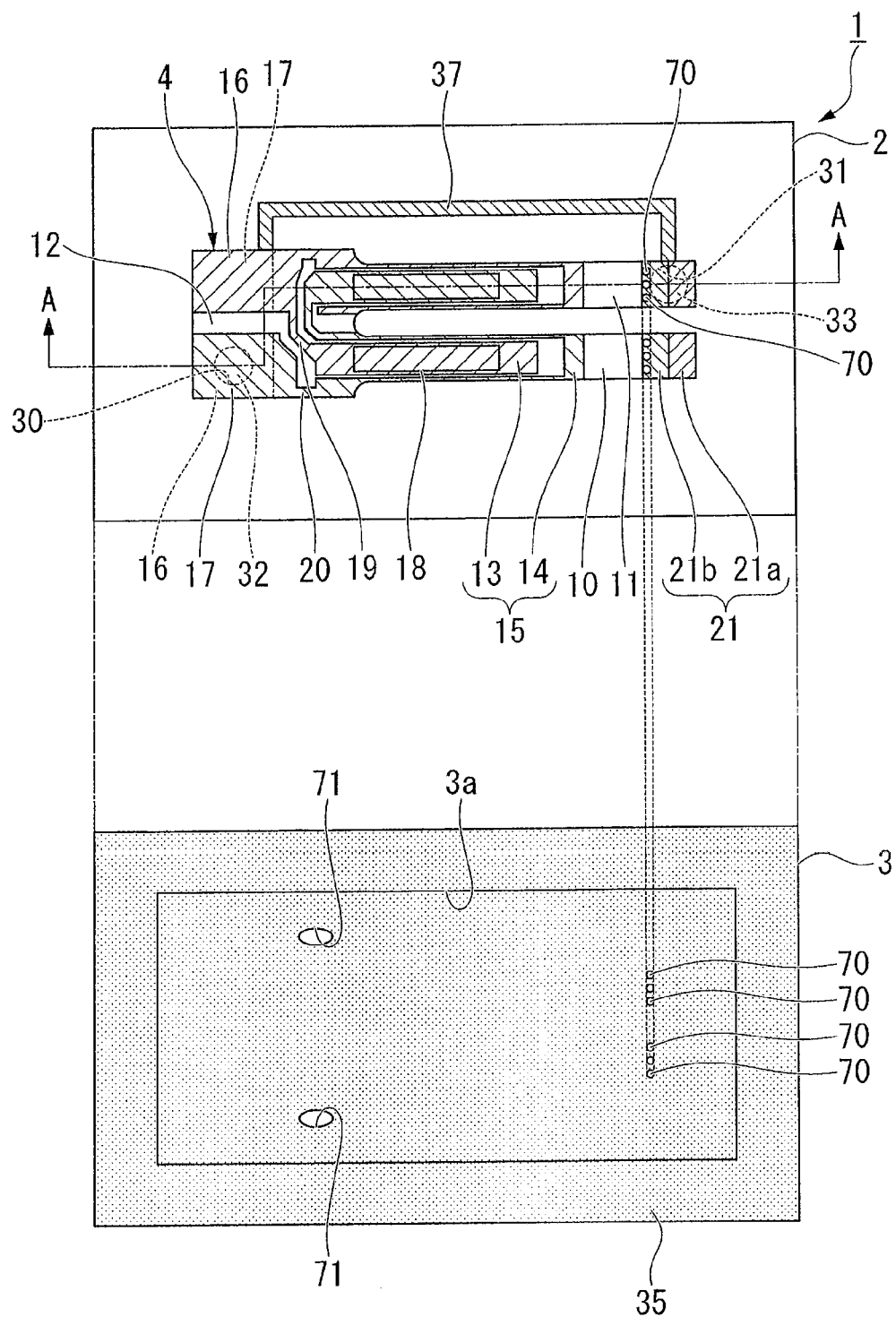
FIG. 2 is a view showing the inner configuration of the piezoelectric vibrator shown in FIG. 1.

As shown in FIGS. 2 and 3, the base board 2 is formed with a pair of through-holes (penetration holes) 30 and 31 penetrating through the base board 2. The pair of through-holes 30 and 31 is formed at both ends of the diagonal line of the cavity C. The pair of through-holes 30 and 31 are formed with a pair of penetration electrodes 32 and 33 which are formed so as to bury the through-holes 30 and 31. The penetration electrodes 32 and 33 are made of a conductive material such as Ag paste. The lower surface of the base board 2 is formed with the pair of outer electrodes 38 and 39 which are electrically connected to the pair of penetration electrodes 32 and 33, respectively.

As shown in FIGS. 2 and 4, the upper surface side of the base board 2 (the bonding surface side to be bonded to the lid board 3) is patterned with the pair of lead-out electrodes 36 and 37 by a conductive material (for example, aluminum). The pair of lead-out electrodes 36 and 37 are patterned so that one penetration electrode 32 of the pair of penetration electrodes 32 and 33 is electrically connected to one mount electrode 16 of the piezoelectric vibrating reed 4, and the other penetration electrode 33 is electrically connected to the other mount electrode 17 of the piezoelectric vibrating reed 4.

Figure 1:
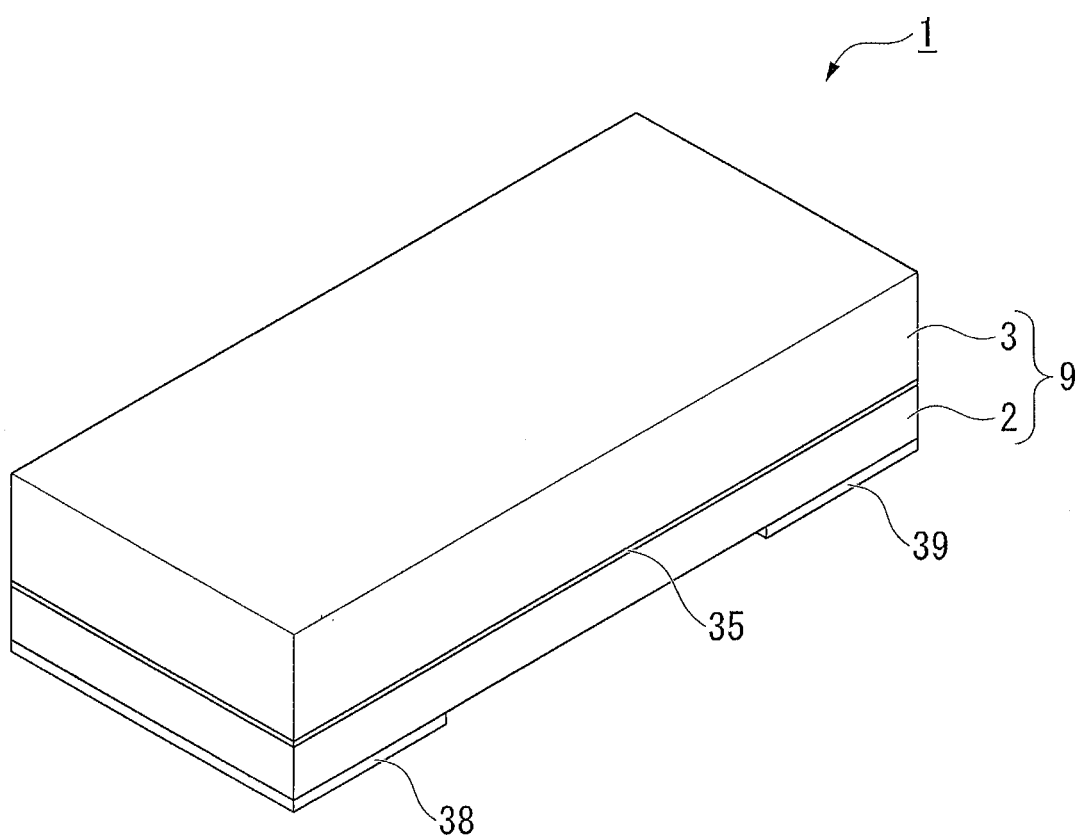
FIG. 1 is a perspective view showing an external appearance of a piezoelectric vibrator according to a first embodiment.

The lid board 3 is a transparent insulating board made of glass material, for example, soda-lime glass, similarly to the base board 2, as shown in FIGS. 1, 3, and 4, and is formed in a board-like form having a size capable of being superimposed onto the base board 2, as shown in FIGS. 1 to 4. In a bonding surface side thereof to be bonded with the base board 2, a rectangular recess portion 3a is formed in which the piezoelectric vibrating reed 4 is accommodated. The recess portion 3a is a recess portion for a cavity serving as the cavity C that accommodates the piezoelectric vibrating reed 4 when the two boards 2 and 3 are superimposed onto each other. The bottom surfaces of recess portions 3a of the lid board 3 are non-polished surfaces (having a ground glass form).

The lid board 3 is anodically bonded to the base board 2 in a state where the recess portion 3a faces the base board 2.

As shown in FIGS. 1 to 4, the piezoelectric vibrator 1 of the present embodiment is provided with a bonding film 35 which is formed over an entire surface of the lid board 3 on the opposite side to the base board 2 so as to bond both boards 2 and 3 to each other at a portion thereof being in contact with the base board 2. As shown in FIGS. 2 and 3, the bonding film 35 of the present embodiment is formed over the entire surface of the surface that defines the recess portion 3a and the peripheral surface of the bonding surface of the lid board 2 extending continuously along the outer periphery of the recess portion 3a. Among these bonding surfaces, a portion of the bonding film 35 formed on the peripheral portion of the bonding surface is bonded to the base board 2.

The bonding film 35 is formed of a material which is capable of absorbing surrounding gas by being activated with laser irradiation. The bonding film 35 is formed of a material which is capable of achieving anodic bonding of both boards 2 and 3. As such a material of the bonding film 35, aluminum can be used, for example.

When the piezoelectric vibrator 1 configured in this manner is operated, a predetermined drive voltage is applied between the outer electrodes 38 and 39 which are formed on the base board 2. In this way, a voltage can be applied to the excitation electrode 15 including the first excitation electrode 13 and the second excitation electrode 14 of the piezoelectric vibrating reed 4, and the pair of vibrating arms 10 and 11 is allowed to vibrate at a predetermined frequency in a direction to move closer to or away from each other. This vibration of the pair of vibrating arms 10 and 11 can be used as the time source, the timing source of a control signal, the reference signal source, and the like.

As shown in FIG. 2, in the present embodiment, the weight metal film 21 and the bonding film 35 are simultaneously irradiated with a laser beam, and first laser irradiation marks 70 are formed therein. Moreover, in the present embodiment, second laser irradiation marks 71 are formed at positions of the bonding film 35 in the cavity C where they do not overlap with the weight metal film 21 as viewed from the normal direction of the base board 2. Moreover, as will be described later, through the presence of these laser irradiation marks 70 and 71, the degree of vacuum in the cavity C can be maintained at a predetermined level or more where the series resonance resistance value does not change greatly.

These laser irradiation marks 70 and 71 are formed when the weight metal film 21 (or the bonding film 35) is irradiated with a laser beam and the weight metal film 21 (or the bonding film 35) is evaporated and removed. For example, when one point of the weight metal film 21 (or the bonding film 35) is irradiated (point-irradiated) with a laser beam, the laser irradiation mark 70 or 71 is formed in a bowl shape. Moreover, when the point-irradiation is repeated by scanning the laser beam at a short distance, the laser irradiation marks 70 and 71 are formed in a groove shape.

In the present embodiment, a plurality of first laser irradiation marks 70 is formed at positions of the weight metal film 21 and the bonding film 35 facing each other in the normal direction of the base board 2. Moreover, the first laser irradiation marks 70 are formed in the fine tuning film 21b of the weight metal film 21. Furthermore, the first laser irradiation marks 70 are formed at positions where they do not overlap with the penetration electrodes 32 and 33, the lead-out electrodes 36 and 37, and the outer electrodes 38 and 39 as viewed from the normal direction of the base board 2.

Moreover, the second laser irradiation marks 71 are formed at positions adjacent to the base portion 12 of the piezoelectric vibrating reed 4. Moreover, the second laser irradiation marks 71 are formed at positions where they do not overlap with the piezoelectric vibrating reed 4, the penetration electrodes 32 and 33, the lead-out electrodes 36 and 37, and the outer electrodes 38 and 39 as viewed from the normal direction of the base board 2.

Manufacturing Method of Piezoelectric Vibrator

Figure 8:
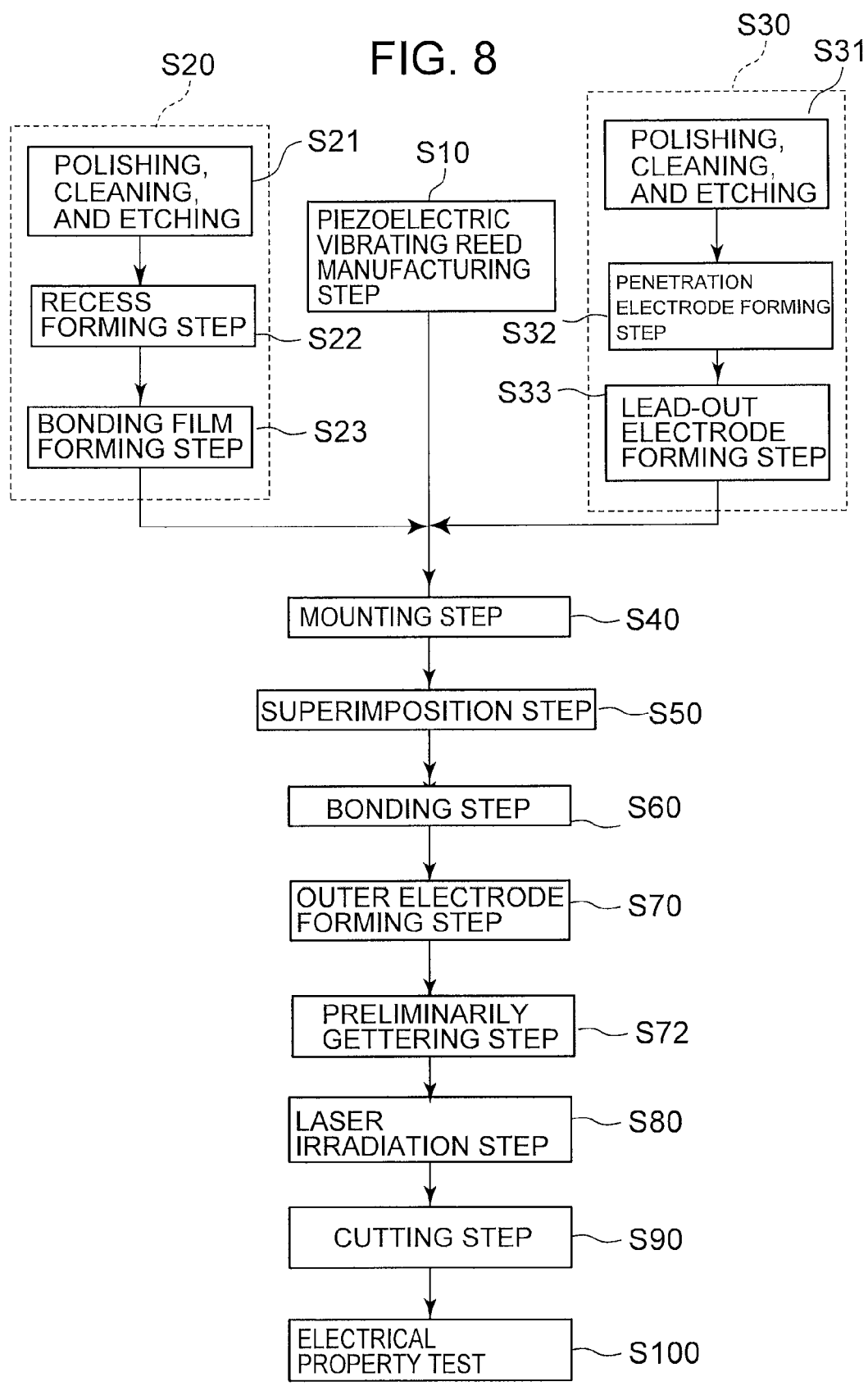
FIG. 8 is a flowchart of the manufacturing method of the piezoelectric vibrator shown in FIG. 1.
Figure 9:
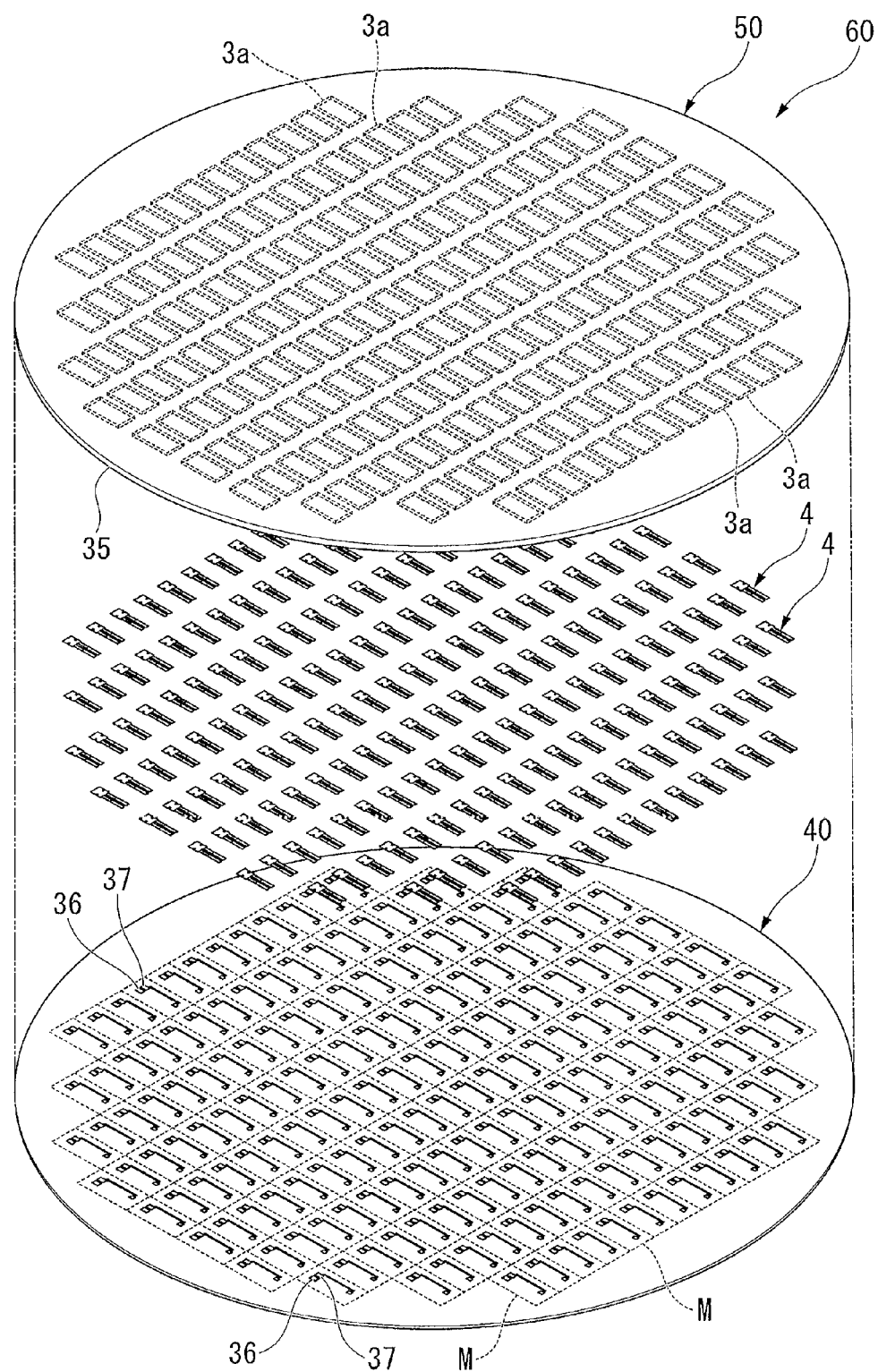
FIG. 9 is an exploded perspective view of a wafer assembly in which a base board wafer and a lid board wafer are anodically bonded to each other in a state where a piezoelectric vibrating reed is accommodated in a cavity.

Next, a method for manufacturing the above-described piezoelectric vibrator 1 will be described with reference to FIGS. 8 and 9. The dotted line M shown in FIG. 9 is a cutting line along which a cutting step performed later is achieved. In the present embodiment, a plurality of piezoelectric vibrators 1 is manufactured at a time by disposing a plurality of piezoelectric vibrating reeds 4 between a base board wafer (base board) 40 and a lid board wafer (lid board) 50.

First, a piezoelectric vibrating reed manufacturing step is performed to manufacture the piezoelectric vibrating reed 4 shown in FIGS. 5 to 7 (S10). Moreover, after the piezoelectric vibrating reed 4 is manufactured, rough tuning of a resonance frequency is performed. This rough tuning is achieved by irradiating the rough tuning film 21a of the weight metal film 21 with a laser beam to evaporate in part the rough tuning film 21a, thus changing a weight thereof. Fine tuning of adjusting the resonance frequency more accurately is performed when a mounting step is performed. This fine tuning will be described later.

Subsequently, as shown in FIG. 9, a first wafer manufacturing step is performed where the lid board wafer 50 later serving as the lid board is manufactured up to a stage immediately before anodic bonding is achieved (S20).

In this step, first, a disk-shaped lid board wafer 50 is formed by polishing a soda-lime glass to a predetermined thickness, cleaning the polished glass, and removing an affected uppermost layer by etching or the like (S21). Subsequently, a recess forming step is performed where a plurality of recess portions 3a to be used as a cavity is formed in a matrix form on a bonding surface of the lid board wafer 50 by etching or the like (S22). After that, a bonding film forming step is performed where a material (e.g., aluminum) capable of absorbing surrounding gas by being activated with laser irradiation and with the possibility of anodic bonding is patterned over the entire surface on the bonding surface side of the lid board wafer 50 (S23). The first wafer manufacturing step ends at this point in time.

Subsequently, at the same or different time as the first wafer manufacturing step, a second wafer manufacturing step is performed where a base board wafer 40 later serving as the base board is manufactured up to a stage immediately before anodic bonding is achieved (S30).

In this step, first, a disk-shaped base board wafer 40 is formed by polishing a soda-lime glass to a predetermined thickness, cleaning the polished glass, and removing an affected uppermost layer by etching or the like (S31). Subsequently, a penetration electrode forming step is performed where a plurality of pairs of penetration electrodes 32 and 33 is formed on the base board wafer 40 (S32). Subsequently, a lead-out electrode forming step is performed where a conductive material is patterned on the upper surface of the base board wafer 40 so as to form lead-out electrodes 36 and 37 (S33). The second wafer manufacturing step ends at this point in time.

Subsequently, a mounting step is performed where a plurality of manufactured piezoelectric vibrating reeds 4 is bonded to the upper surface of the base board wafer 40 with the lead-out electrodes 36 and 37 disposed therebetween (S40). First, bumps B made of gold or the like are formed on the pair of lead-out electrodes 36 and 37. The base portion 12 of the piezoelectric vibrating reed 4 is placed on the bumps B, and the piezoelectric vibrating reed 4 is pressed against the bumps B while heating the bumps B to a predetermined temperature. In this way, the piezoelectric vibrating reed 4 is mechanically supported by the bumps B to be floated from the upper surface of the base board wafer 40, and the mount electrodes 16 and 17 are electrically connected to the lead-out electrodes 36 and 37.

After the piezoelectric vibrating reed 4 is mounted, a superimposition step is performed where the lid board wafer 50 is superimposed onto the base board wafer 40 as shown in FIG. 9 (S50). Specifically, both wafers 40 and 50 are aligned at a correct position using reference marks or the like not shown in the figure as indices. In this way, the mounted piezoelectric vibrating reed 4 is accommodated in the cavity C which is formed between both wafers 40 and 50.

After the superimposition step is performed, a bonding step is performed where the two superimposed wafers 40 and 50 are inserted into an anodic bonding machine not diagrammatically included to achieve anodic bonding under a predetermined temperature atmosphere with application of a predetermined voltage (S60). Specifically, a predetermined voltage is applied between the bonding film 35 and the lid board wafer 50. Then, an electrochemical reaction occurs at an interface between the bonding film 35 and the lid board wafer 50, whereby they are closely adhered tightly and anodically bonded. In this way, the piezoelectric vibrating reed 4 can be sealed in the cavity C, and a wafer assembly 60 can be obtained in which the base board wafer 40 and the lid board wafer 50 are bonded to each other.

After the anodic bonding is completed, an outer electrode forming step is performed where a conductive material is patterned onto the lower surface of the base board wafer 40 so as to form a plurality of pairs of outer electrodes 38 and 39 (S70). By this step, the wafer assembly 60 in which a plurality of piezoelectric vibrators 1 is connected to each other can be obtained. The piezoelectric vibrating reed 4 which is sealed in the cavity C can be operated via the penetration electrodes 32 and 33 from the outer electrodes 38 and 39.

Subsequently, a preliminary gettering step is performed where portions of the bonding film 35 in the cavity C are irradiated with a laser beam, the portions being located at positions where they do not overlap with the weight metal film 21 as viewed from the normal direction of the base board wafer 40 (S72). As a laser source, a YAG laser or the like can be used similar to that used in a laser irradiation step described later. Since in the present embodiment, the bottom surfaces of recess portions 3a of the lid board wafer 50 are non-polished surfaces (having a ground glass form), it is difficult to perform laser irradiation from the outside (the upper surface side of the piezoelectric vibrator 1) of the lid board wafer 50. For this reason, laser irradiation is performed from the outer side (the lower surface side of the piezoelectric vibrator 1) of the base board wafer 40.

Here, since the bonding film 35 is formed of a material which is capable of absorbing surrounding gas by being activated with laser irradiation, when the bonding film 35 (e.g., Al) is evaporated by the laser irradiation, the bonding film 35 absorbs oxygen in the cavity C to form metal oxides (e.g., $Al_2O_3$). Therefore, when the bonding film 35 is irradiated with a laser beam, oxygen in the cavity C is consumed, whereby the degree of vacuum in the cavity C can be increased.

In the present embodiment, the preliminary gettering step is performed until it is determined that the degree of vacuum in the cavity C will be increased to the above-described predetermined level or more by the execution of a laser irradiation step to be performed later. This determination may be made based on the series resonance resistance value which is measured by applying a voltage to the pair of outer electrodes 38 and 39 and vibrating the piezoelectric vibrating reed 4 and may be made based on the size of the surface area of the laser-irradiated regions of the bonding film 35.

Subsequently, a laser irradiation step is performed where the fine tuning film 21b (weight metal film 21) and the bonding film 35 are simultaneously irradiated with a laser beam (S80). At this time, the fine tuning film 21b and the bonding film 35 are irradiated with a laser beam along the normal direction of the base board wafer 40 from the outer side of the base board wafer 40.

In the present embodiment, in this laser irradiation step, fine tuning of frequency is performed so that the frequencies of the individual piezoelectric vibrating reeds 4 sealed in the cavities C fall within a predetermined range.

Specifically, a voltage is applied to the pair of outer electrodes 38 and 39 which are formed on the lower surface of the base board wafer 40, thus allowing the piezoelectric vibrating reeds 4 to vibrate. A laser beam is irradiated onto the base board wafer 40 from the outside while measuring the vibration frequencies to evaporate and trim the fine tuning film 21b of the weight metal film 21. When the fine tuning film 21*b* is trimmed, since the weight on the tip ends of the pair of vibrating arms 10 and 11 decreases, the frequency of the piezoelectric vibrating reed 4 increases. Given this, the fine tuning can be performed in such a way that the frequency of the piezoelectric vibrating reed 4 falls within the predetermined range of the nominal frequency.

Furthermore, in this laser irradiation step, by simultaneously irradiating the fine tuning film 21*b* and the bonding film 35 with a laser beam, it is possible to increase the degree of vacuum in the cavity C by gettering the bonding film 35 simultaneously with the adjusting of the frequency of the piezoelectric vibrating reed 4 by trimming the fine tuning film 21*b*.

After the laser irradiation step is completed, a cutting step is performed where the wafer assembly 60 shown in FIG. 9 is cut along the cutting line M to obtain small fragments (S90). As a result, a plurality of two-layered SMD-type piezoelectric vibrators 1 shown in FIG. 1, in which the piezoelectric vibrating reed 4 is sealed in the cavity C formed between the base board 2 and the lid board 3 being anodically bonded together, can be manufactured at a time.

The preliminary gettering step (S72) and the laser irradiation step (S80) may be performed after performing the cutting step (S90) to obtain the individual fragments of the piezoelectric vibrators 1. However, as described above, by performing the preliminary gettering step (S72) and the laser irradiation step (S80) earlier, since the gettering and the fine tuning can be performed on the wafer assembly 60, it is possible to manufacture the plurality of piezoelectric vibrators 1 more efficiently. Therefore, it is desirable because throughput can be increased.

Subsequently, an electrical property test of the piezoelectric vibrating reed 4 is conducted (S100). That is, the resonance frequency, resonance resistance value, drive level properties (the excitation power dependence of the resonance frequency and the resonance resistance value), and the like of the piezoelectric vibrating reed 4 are measured and checked. Moreover, the insulation resistance properties and the like are compared and checked as well. Finally, an external appearance test of the piezoelectric vibrator 1 is conducted to check the dimensions, the quality, and the like. In this way, the manufacturing of the piezoelectric vibrator 1 ends.

As described above, according to the manufacturing method of the piezoelectric vibrator according to the present embodiment, during the laser irradiation step, if the fine tuning film 21*b* and the bonding film 35 are simultaneously irradiated with a laser beam, it is possible to increase the degree of vacuum in the cavity C by gettering the bonding film 35 simultaneously with the adjustment of the frequency of the piezoelectric vibrating reed 4 by trimming the fine tuning film 21*b*.

Moreover, since the bonding film 35 is formed of a material which is capable of absorbing surrounding gas by being activated with laser irradiation, it is not necessary to form an additional gettering material.

Given the above, it is possible to manufacture the piezoelectric vibrator 1 with high efficiency and thus to achieve cost-reduction of the piezoelectric vibrator 1.

Moreover, since the manufacturing method includes the preliminary gettering step, it is possible to increase the degree of vacuum in the cavity C further to an extent similar to that achieved by gettering the bonding film 35 during the laser irradiation step to increase the degree of vacuum in the cavity C.

Furthermore, since the preliminary gettering step is performed before the laser irradiation step, it is possible to adjust the frequency of the piezoelectric vibrating reed 4 with higher precision than a case of performing the preliminary gettering step after the laser irradiation step.

That is to say, when the preliminary gettering step is performed, there is a case where materials constituting the bonding film 35 having been irradiated with a laser beam are scattered and deposited onto the vibrating arms 10 and 11, thus changing the frequency of the piezoelectric vibrating reed 4. For this reason, when the preliminary gettering step is performed after the laser irradiation step, there is a concern that the frequency of the piezoelectric vibrating reed 4 having been adjusted by the laser irradiation step will be changed by the execution of the preliminary gettering step. However, if the preliminary gettering step is performed before the laser irradiation step, even when the frequency of the piezoelectric vibrating reed 4 is changed by the preliminary gettering step, the frequency can be adjusted later in the laser irradiation step. Therefore, it is possible to adjust the frequency of the piezoelectric vibrating reed 4 with high precision.

Second Embodiment

Figure 10:
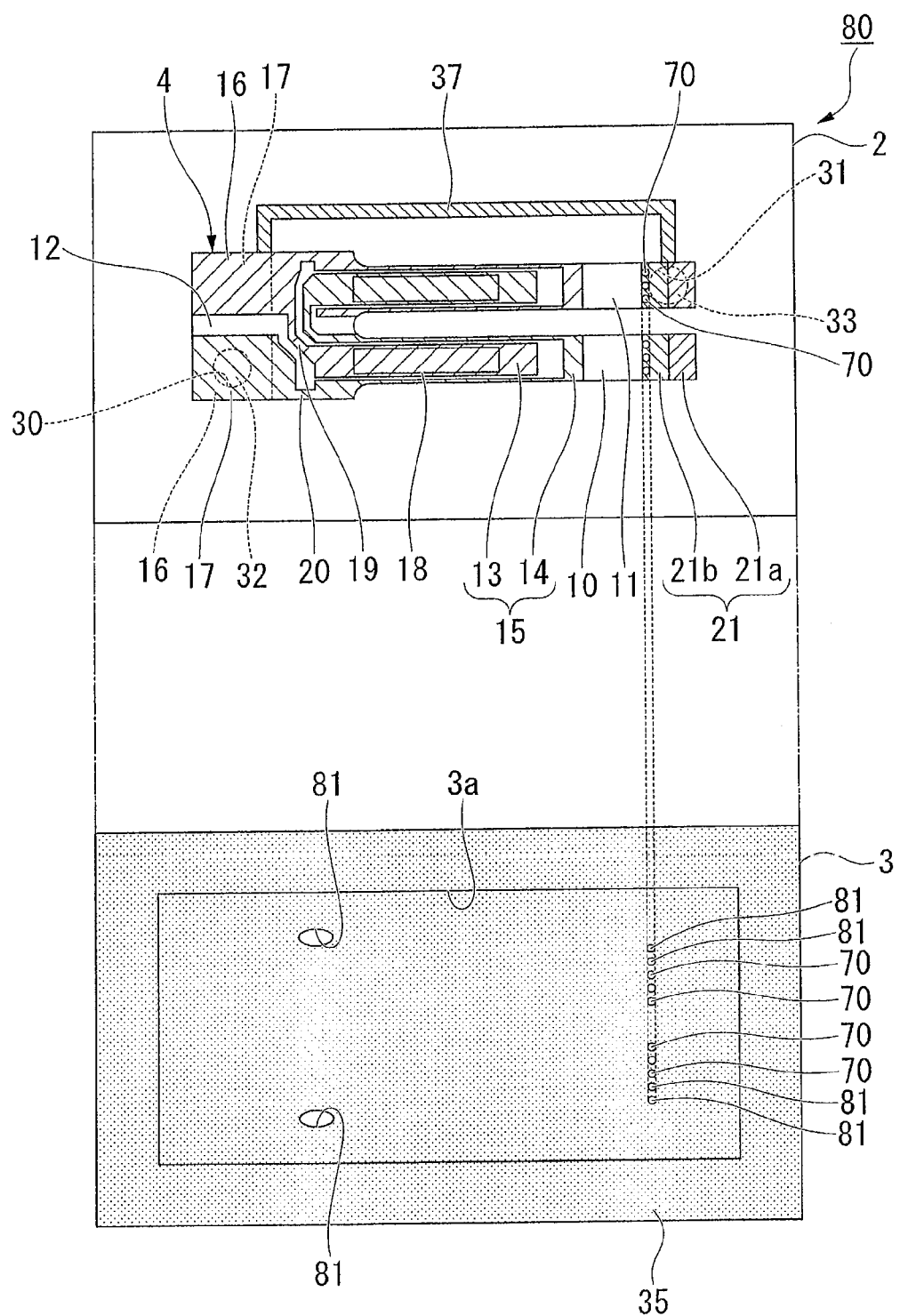
FIG. 10 is a view showing the inner configuration of a piezoelectric vibrator according to a second embodiment.

Next, a piezoelectric vibrator according to a second embodiment of the present invention will be described with reference to FIG. 10.

In the second embodiment, the same constituent elements as those in the first embodiment will be denoted by the same reference numerals, and description thereof will be omitted and only the points of difference will be described.

In a piezoelectric vibrator 80 of the present embodiment, second laser irradiation marks 81 are formed at a position of the bonding film 35 at least adjacent to the tip ends of the vibrating arms 10 and 11 as viewed from the normal direction of the base board wafer 40. Moreover, in the example shown in the drawing, the second laser irradiation marks 81 are formed at positions adjacent to the base portion 12 of the piezoelectric vibrating reed 4.

Next, a method of manufacturing the above-described piezoelectric vibrator 80 will be described. In the present embodiment, the laser irradiation step includes a step of irradiating portions of the bonding film 35 with a laser beam, the portions being adjacent to the tip ends of the vibrating arms 10 and 11 as viewed from the normal direction of the base board wafer 40. By this laser irradiation step, it is possible to cause materials constituting the bonding film 35 to be scattered and deposited onto the tip ends of the vibrating arms 10 and 11, thus decreasing the frequency of the piezoelectric vibrating reed 4.

As described above, according to the manufacturing method of the piezoelectric vibrator according to the present embodiment, by irradiating portions of the bonding film 35 with a laser beam, the portions being adjacent to the tip ends of the vibrating arms 10 and 11 as viewed from the normal direction of the base board wafer 40, it is possible to perform frequency adjustment in a direction of decreasing the frequency of the piezoelectric vibrating reed 4 and thus to increase the yield of the piezoelectric vibrator 80.

That is to say, even when the laser irradiation step results in the fine tuning film 21*b* being trimmed so much as to increase excessively the frequency of the piezoelectric vibrating reed 4, by irradiating portions of the bonding film 35 with a laser beam, the portions being adjacent to the tip ends of the vibrating arms 10 and 11, it is possible to achieve frequency adjustment in a direction of decreasing the frequency of the piezoelectric vibrating reed 4. By doing so, it is possible to increase the yield of the piezoelectric vibrator 80 since it is not necessary to disuse the piezoelectric vibrator 80 even in the case of the piezoelectric vibrating reed 4 whose frequency is increased such that disusing it is unavoidable as in the related art.

Oscillator

Next, an oscillator according to an embodiment of the present invention will be described with reference to FIG. 11.

In the following embodiments, the piezoelectric vibrator 1 according to the first embodiment is used as the piezoelectric vibrator. However, the same operational effect can be obtained with the piezoelectric vibrator 80 according to the second embodiment.

Figure 11:
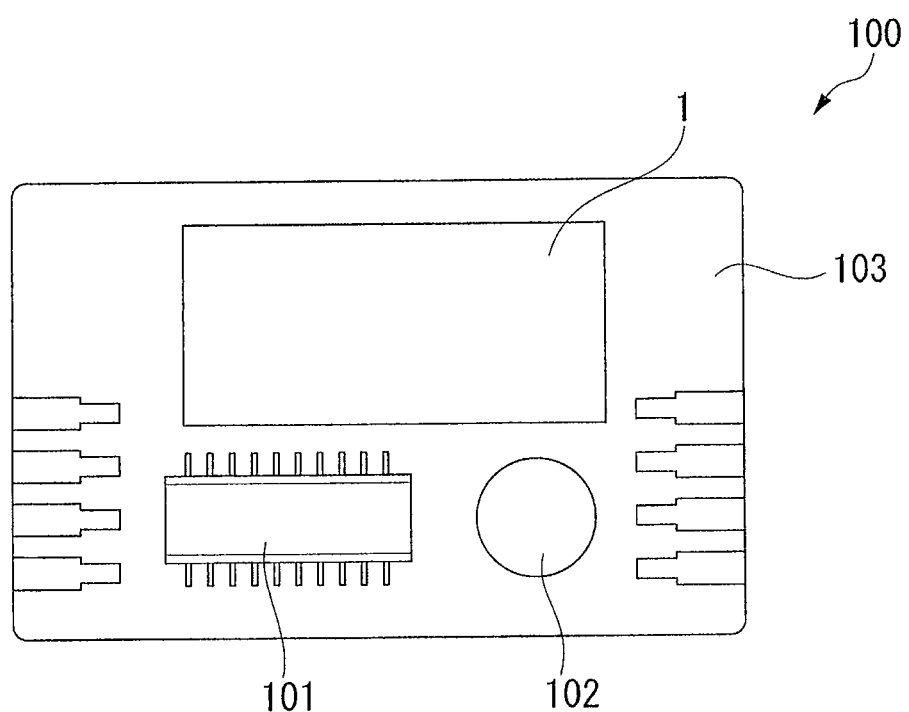
FIG. 11 is a view showing the schematic configuration of an oscillator.

As shown in FIG. 11, an oscillator 100 of the present embodiment is one in which the piezoelectric vibrator 1 is configured as an oscillating piece that is electrically connected to an integrated circuit 101. The oscillator 100 includes a board 103 on which an electronic component 102 such as a capacitor is mounted. The integrated circuit 101 for the oscillator is mounted on the board 103, and the piezoelectric vibrating reed 4 of the piezoelectric vibrator 1 is mounted in the vicinity of the integrated circuit 101. The electronic component 102, integrated circuit 101, and piezoelectric vibrator 1 are electrically connected by a wiring pattern which is not shown. It should be noted that these components are molded by resin which is not shown.

In the oscillator 100 configured in this manner, the piezoelectric vibrating reed 4 in the piezoelectric vibrator 1 vibrates when a voltage is applied to the piezoelectric vibrator 1. This vibration is converted to an electrical signal by the piezoelectric properties of the piezoelectric vibrating reed 4 and is then input to the integrated circuit 101 as the electrical signal. The input electrical signal is subjected to various kinds of processing by the integrated circuit 101 and is then output as a frequency signal. In this way, the piezoelectric vibrator 1 functions as an oscillating piece.

By selectively setting the configuration of the integrated circuit 101, for example, an RTC (Real Time Clock) module, according to the demands, it is possible to add a function of controlling the date or time for operating the device or an external device or providing the time or calendar other than a single-function oscillator for a clock.

According to the present embodiment, since the oscillator 100 includes the piezoelectric vibrator 1 which can be manufactured at a low cost, it is possible to reduce the cost of the oscillator 100.

Electronic Device

Figure 12:
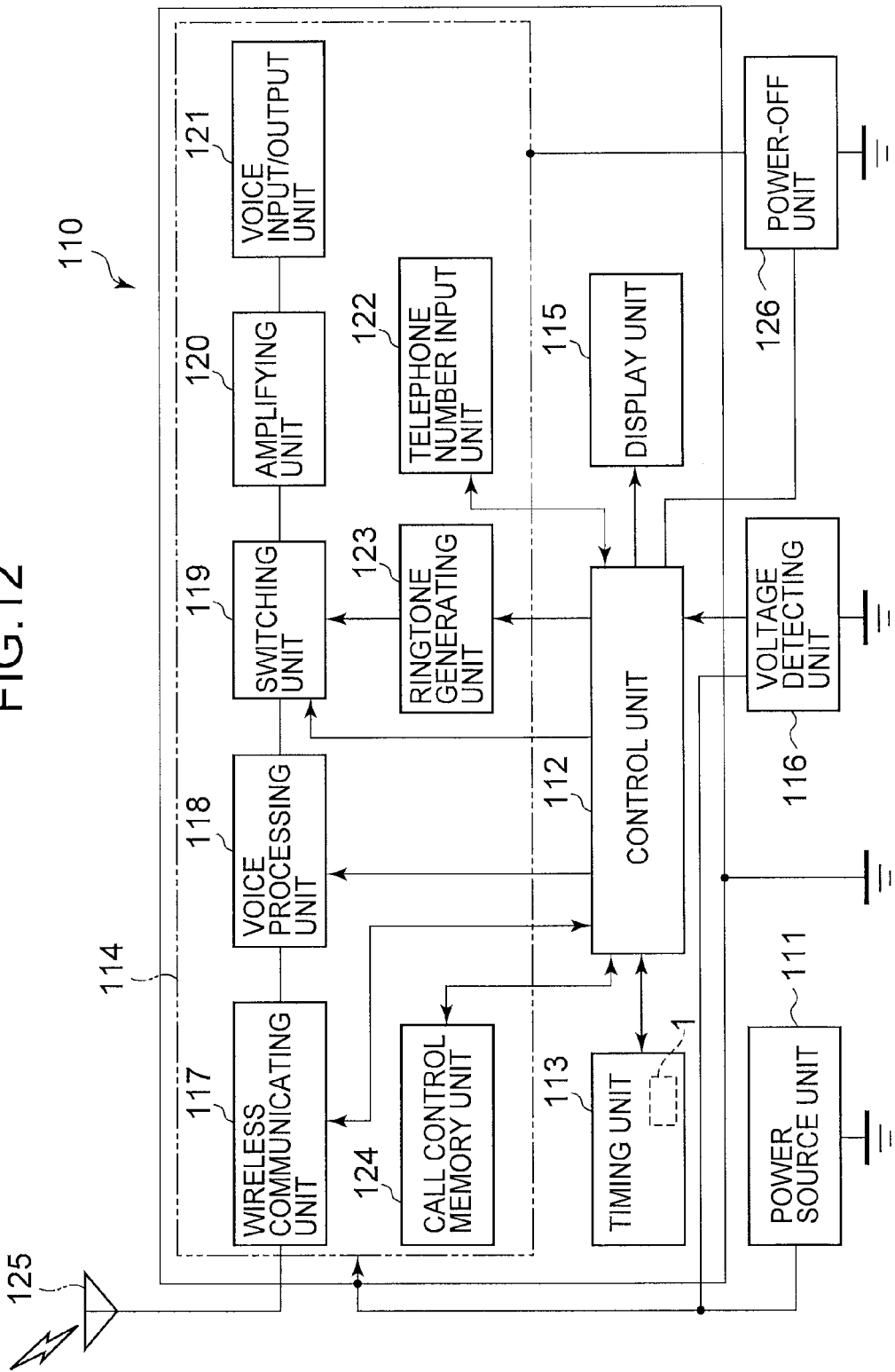
FIG. 12 is a block diagram of an electronic device.

Next, an electronic device according to an embodiment of the present invention will be described with reference to FIG. 12. The present embodiment will be described by way of the example of a portable information device 110 having the piezoelectric vibrator 1 as an example of the electronic device. First, the portable information device 110 of the present embodiment is represented, for example, by a cellular phone and is one that is developed and improved upon a wristwatch of the related art. The portable information device 110 looks like a wristwatch in external appearance and is provided with a liquid crystal display at a portion corresponding to the dial pad and is capable of displaying the current time or the like on the screen. When the portable information device 110 is used as a communication tool, the user removes it from the wrist and makes the same communications as with a cellular phone of the related art using the internal speaker and microphone on the inner side of its strap. However, the portable information device is remarkably small and light compared with the cellular phone of the related art.

Next, the configuration of the portable information device 110 of the present embodiment will be described. As shown in FIG. 12, the portable information device 110 includes the piezoelectric vibrator 1 and a power supply portion 111 for supplying power. The power supply portion 111 is formed, for example, of a lithium secondary battery. The power supply portion 111 is connected in parallel to a control portion 112 that performs various kinds of control, a time counting portion 113 that measures the time or the like, a communication portion 114 that makes communications with the outside, a display portion 115 that displays various kinds of information, and a voltage detection portion 116 that detects voltages at the respective function portions. The power supply portion 111 supplies power to the respective functional portions.

The control portion 112 controls the respective function portions so as to control operations of the overall system, such as operations to transmit and receive audio data and operations to count and display the current time. The control portion 112 includes a ROM in which a program is written in advance, a CPU that reads out and runs the program written to the ROM, a RAM used as a work area of the CPU, and the like.

The time counting portion 113 includes an integrated circuit enclosing an oscillation circuit, a register circuit, a counter circuit, and an interface circuit, and the like as well as the piezoelectric vibrator 1. When a voltage is applied to the piezoelectric vibrator 1, the piezoelectric vibrating reed 4 vibrates, and this vibration is converted to an electrical signal by the piezoelectric properties of the quartz crystal and is input to the oscillation circuit as the electrical signal. The output of the oscillation circuit is converted to a digital form and counted by the register circuit and the counter circuit. Signals are transmitted and received to and from the control portion 112 via the interface circuit, and the current time and the current date or the calendar information or the like are displayed on the display portion 115.

The communication portion 114 is provided with the same functions as those of the cellular phone of the related art, and includes a wireless portion 117, an audio processing portion 118, a switching portion 119, an amplifier portion 120, an audio input/output portion 121, a telephone number input portion 122, a ring tone generation portion 123, and a call control memory portion 124.

The wireless portion 117 carries out transmission and reception of various kinds of data, such as audio data, with the base station via an antenna 125. The audio processing portion 118 encodes and decodes an audio signal input therein from the wireless portion 117 or the amplifier portion 120. The amplifier portion 120 amplifies a signal input therein from the audio processing portion 118 or the audio input/output portion 121 to a specific level. The audio input/output portion 121 is formed of a speaker and a microphone and the like, and makes a ring tone and incoming audio louder as well as collects audio.

The ring tone generation portion 123 generates a ring tone in response to a call from the base station. The switching portion 119 switches the amplifier portion 120 normally connected to the audio processing portion 118 to the ring tone generation portion 123 only when a call arrives, so that the ring tone generated in the ring tone generation portion 123 is output to the audio input/output portion 121 via the amplifier portion 120.

The call control memory portion 124 stores a program relating to incoming and outgoing call control for communications. The telephone number input portion 122 includes, for example, numeric keys from 0 to 9 and other keys and the user inputs the telephone number of the communication receiver by depressing these numeric keys and the like.

The voltage detection portion 116 detects a voltage drop when a voltage being applied to each function portion, such as the control portion 112, by the power supply portion 111 drops below the predetermined value, and notifies the control portion 112 of the detection. The predetermined voltage value referred to herein is a value pre-set as the lowest voltage necessary to operate the communication portion 114 in a stable manner, and for example, about 3 V. Upon receipt of a notification of a voltage drop from the voltage detection portion 116, the control portion 112 disables the operation of the wireless portion 117, the audio processing portion 118, the switching portion 119, and the ring tone generation portion 123. In particular, it is essential to stop the operation of the wireless portion 117 that consumes a large amount of power. Furthermore, a message informing that the communication portion 114 is unavailable due to insufficient battery power is displayed on the display portion 115.

More specifically, it is possible to disable the operation of the communication portion 114 and display the notification message on the display portion 115 by the voltage detection portion 116 and the control portion 112. This message may be displayed as a character message, or as a more intuitive indication, which may be displayed by putting a cross mark on the telephone icon displayed at the top of the display screen of the display portion 115.

By providing a power shutdown portion 126 capable of selectively shutting down the power supply to portions involved with the function of the communication portion 114, it is possible to stop the function of the communication portion 114 in a more reliable manner.

According to the present embodiment, since the portable information device 110 includes the piezoelectric vibrator 1 which can be manufactured at a low cost, it is possible to reduce the cost of the portable information device 110.

Radio-Controlled Clock

Next, a radio-controlled clock according to an embodiment of the present invention will be described with reference to FIG. 13.

Figure 13:
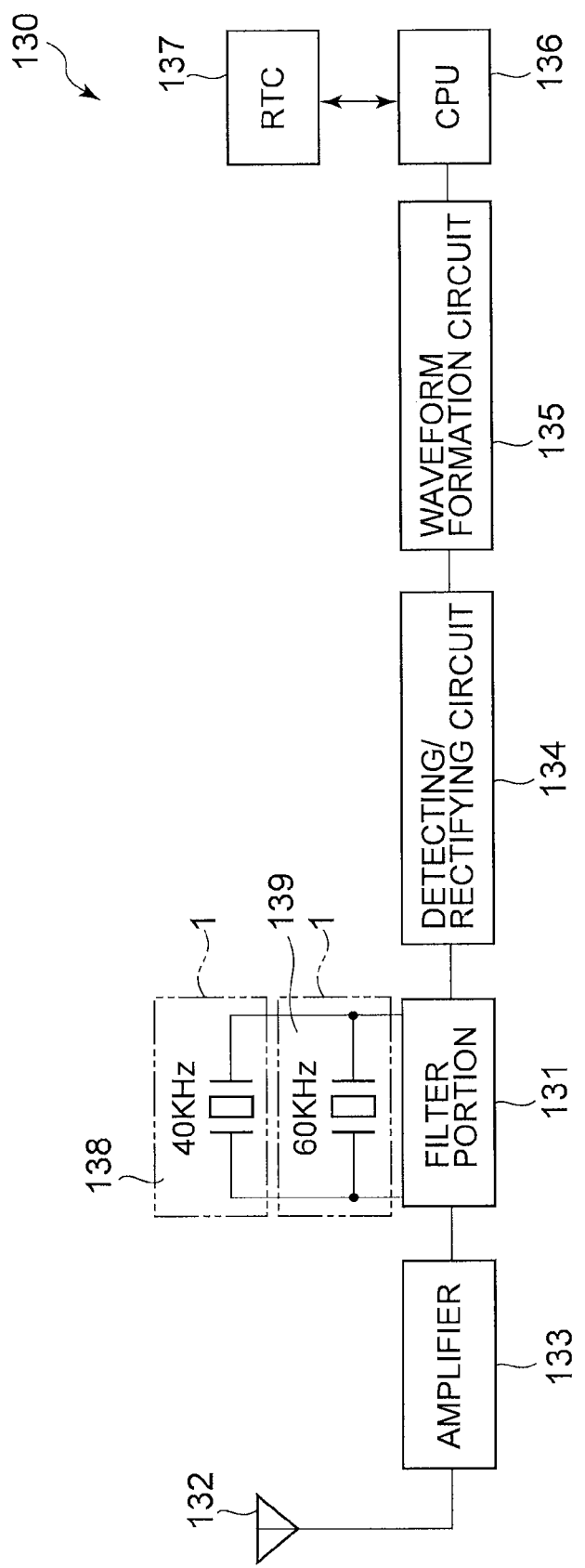
FIG. 13 is a block diagram of a radio-controlled clock.
Figure 14:
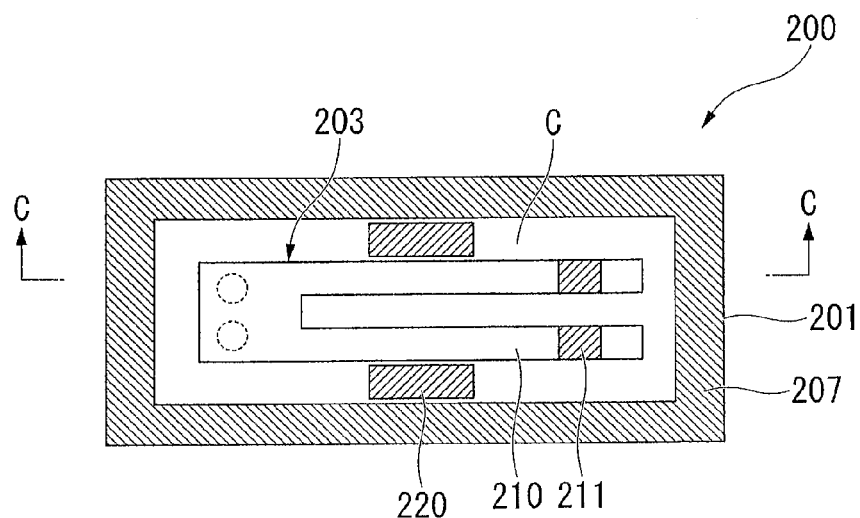
FIG. 14 is a plan view showing a state where a lid board of a piezoelectric vibrator according to the related art is removed.
Figure 15:
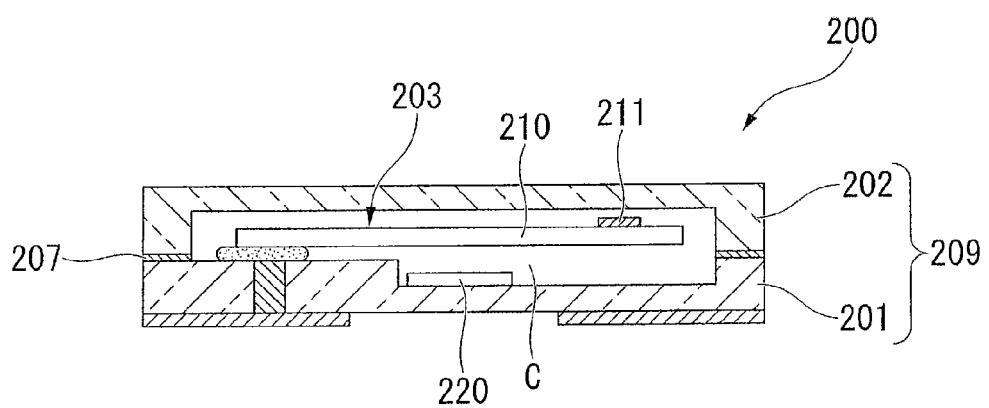
FIG. 15 is a sectional view taken along the line C-C in FIG. 14.

As shown in FIG. 13, a radio-controlled clock 130 of the present embodiment includes the piezoelectric vibrators 1 electrically connected to a filter portion 131. The radio-controlled clock 130 is a clock provided with the function of displaying the correct time by automatically correcting the time upon receipt of a standard radio wave including the clock information.

In Japan, there are transmission centers (transmission stations) that transmit a standard radio wave in Fukushima Prefecture (40 kHz) and Saga Prefecture (60 kHz), and each center transmits the standard radio wave. A wave as long as 40 kHz or 60 kHz is of a kind to propagate along the land surface and of a kind to propagate while reflecting between the ionospheric layer and the land surface, and therefore has a propagation range wide enough to cover all Japan through the two transmission centers.

Hereinafter, the functional configuration of the radio-controlled clock 130 will be described in detail.

An antenna 132 receives the long standard radio wave at 40 kHz or 60 kHz. The long standard radio wave is made up of time information called a time code which is modulated by the AM modulation scheme and carried on a carrier wave of 40 kHz or 60 kHz. The received long standard wave is amplified by an amplifier 133 and filtered and synchronized by the filter portion 131 having a plurality of piezoelectric vibrators 1. In the present embodiment, the piezoelectric vibrators 1 include quartz vibrator portions (piezoelectric vibrating reeds) 138 and 139 having resonance frequencies at 40 kHz and 60 kHz which are the same as the carrier frequency.

Furthermore, the filtered signal at the specific frequency is detected and demodulated by a detection and rectification circuit 134. Subsequently, the time code is extracted by a waveform shaping circuit 135 and counted by the CPU 136. The CPU 136 reads out information about the current year, the total number of days, the day of the week, and the time and the like. The read information is reflected on the RTC 137 and the precise time information is displayed.

Because the carrier wave is 40 kHz or 60 kHz, a vibrator having the tuning-fork structure described above is suitable for the quartz vibrator portions 138 and 139.

Although the above description has been given of the example in Japan, the frequency of the long standard wave is different overseas. For example, a standard wave of 77.5 kHz is used in Germany. When the radio-controlled clock 130 operable as well overseas is incorporated into a portable device, the piezoelectric vibrator 1 set at the frequency different from the frequencies used in Japan is required.

According to the present embodiment, since the radio-controlled clock 130 includes the piezoelectric vibrator 1 which can be manufactured at a low cost, it is possible to reduce the cost of the radio-controlled clock 130.

It should be noted that the technical scope of the present invention is not limited to the embodiments above, and the present invention can be modified in various ways without departing from the spirit of the present invention.

For example, although the above-described embodiments have been described by way of an example of the grooved piezoelectric vibrating reed 4 in which the groove portions 18 are formed on both surfaces of the vibrating arms 10 and 11 as an example of the piezoelectric vibrating reed 4, the piezoelectric vibrating reed 4 may be a type of piezoelectric vibrating reed without the groove portions 18. However, since the electric field efficiency between the pair of the excitation electrodes 15 when a predetermined voltage is applied to the pair of excitation electrodes 15 can be increased by forming the groove portions 18, it is possible to suppress the vibration loss further and to improve the vibration properties much more. That is to say, it is possible to decrease the CI value (crystal impedance) further and to improve the performance of the piezoelectric vibrating reed 4 further. In this respect, it is preferable to form the groove portions 18.

Moreover, although in the above-described embodiments, the base board 2 and the lid board 3 are anodically bonded by the bonding film 35, the bonding method is not limited to the anodic bonding. However, anodic bonding is preferable because the anodic bonding can tightly bond both boards 2 and 3.

Furthermore, although in the above-described embodiments, the piezoelectric vibrating reed 4 is bonded by bumps, the bonding method is not limited to bump bonding. For example, the piezoelectric vibrating reed 4 may be bonded by a conductive adhesive agent. However, since the bump bonding allows the piezoelectric vibrating reed 4 to be floated from the upper surface of the base board 2, it is naturally possible to secure the minimum vibration gap necessary for vibration of the piezoelectric vibrating reed 4. Therefore, bump bonding is preferable.

Furthermore, while in the above-described embodiments, the manufacturing method of the piezoelectric vibrator includes the preliminary gettering step, the present invention is not limited to this. That is to say, the preliminary gettering step may not be performed, and the piezoelectric vibrators 1 and 80 may be formed without the second laser irradiation marks 71 and 81. Even when the manufacturing method includes the preliminary gettering step, the preliminary gettering step may be performed after the laser irradiation step rather than before the laser irradiation step.

Besides, within a range not deviating from the object of the present invention, constituent elements of the above-described embodiments may be appropriately substituted with well-known constituent elements, and the above-described modified examples may be appropriately combined.

What is claimed is:

1. A piezoelectric vibrator comprising:
a hermetically closed casing comprising first and second substrates with a cavity therebetween, wherein at least one of the first and second substrates comprises a translucent material;
a bonding film comprising a gettering material and extending over at least part of a surface of at least one of the first and second substrates which faces the other substrate, wherein the first and second substrates are anodically bonded via the bonding film; and
a piezoelectric vibrating strip secured inside the cavity and comprising an adjustable weight metal film at the tip end thereof, wherein the adjustable weight metal film comprises a series of laser irradiation marks,
wherein the bonding film has a corresponding number of laser irradiation marks at corresponding locations to a number and locations of the series of laser irradiation marks of the adjustable weight metal film, and both of the irradiation marks of the bonding film and the adjustable weight metal film are formed by simultaneous irradiations of laser.

2. The piezoelectric vibrator according to claim 1, wherein the adjustable weight metal film has a series of irradiation marks, and the bonding film has irradiation marks more than a number of irradiation marks of the adjustable weight metal film.

3. The piezoelectric vibrator according to claim 1, wherein the piezoelectric vibrating strip has a pair of vibrating arms and the adjustable weight metal film is applied to distal end portions of the arms.

4. An oscillator comprising the piezoelectric vibrator according to claim 1, which is connected to an integrated circuit of the oscillator.

5. An electronic device comprising:
a clock; and
the piezoelectric vibrator according to claim 1 electrically connected to the clock.

6. A radio-controlled clock comprising:
a filter; and
the piezoelectric vibrator according to claim 1 electrically connected to the filter.

* * * * *